(12) United States Patent
Tsao (10) Patent No.: US 12,040,802 B1
(45) Date of Patent: Jul. 16, 2024

(54) DIGITAL SUBSCRIBER LINE COMMUNICATION DEVICE AND TIMING RECOVERY METHOD THEREOF

(71) Applicant: REALTEK SEMICONDUCTOR CORPORATION, Hsinchu (TW)

(72) Inventor: Meng-Chieh Tsao, San Jose, CA (US)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 7 days.

(21) Appl. No.: 18/121,833

(22) Filed: Mar. 15, 2023

(51) Int. Cl.
*H03L 7/08* (2006.01)
*H03L 7/081* (2006.01)

(52) U.S. Cl.
CPC .......... *H03L 7/0807* (2013.01); *H03L 7/0814* (2013.01)

(58) Field of Classification Search
CPC ......... H04B 3/23; H04B 3/32; H04L 27/2655; H04L 27/2662; H04L 27/2675; H04L 27/2691; H04L 27/2613; H04L 7/0083; H03L 7/0807; H03L 7/0814
See application file for complete search history.

(56) References Cited

U.S. PATENT DOCUMENTS

| | | | | |
|---|---|---|---|---|
| 6,985,548 | B1* | 1/2006 | Jabbar ................ | H04L 27/2662 375/376 |
| 2003/0108094 | A1* | 6/2003 | Lai .......................... | H04B 3/23 375/222 |
| 2014/0119250 | A1* | 5/2014 | Sorbara ............... | H04L 27/2656 370/294 |
| 2014/0161000 | A1* | 6/2014 | Fazlollahi ............ | H04M 11/062 370/280 |

* cited by examiner

*Primary Examiner* — Khanh C Tran
(74) *Attorney, Agent, or Firm* — WPAT, PC (57) ABSTRACT

A timing recovery method includes the following operations: performing a time domain timing recovery process according to a predefined cyclic prefix portion of a first symbol during a downstream time-division duplexing frame period to tune a phase locked loop circuit; and performing a frequency domain timing recovery process according to at least one second symbol that follows the first symbol during the downstream time-division duplexing frame period to tune the phase locked loop circuit.

17 Claims, 8 Drawing Sheets

DIGITAL SUBSCRIBER LINE COMMUNICATION DEVICE AND TIMING RECOVERY METHOD THEREOF

BACKGROUND OF THE INVENTION

1. Field of the Invention

The present disclosure relates to a digital subscriber line (DSL) communication device. More particularly, the present disclosure relates to a DSL communication device based on a G.fast (fast access to subscriber terminals) protocol standard and a timing recovery method thereof.

2. Description of Related Art

For a time-division duplexing (TDD) system, upstream signals and downstream signals are separately transmitted on time domain. In other words, the signals transmission is discontinuous in time, which results a difficulty on the timing synchronization of the TDD system. For example, a receiver in a slave device of the TDD system may stop receiving signals during an upstream frame period. Under this condition, the receiver may be unable to keep accurate timing tracking during the upstream frame period and may accumulate excessive timing errors. As a result, the receiver may be unable to correctly receive incoming signal during a downstream frame period, which results in a poor system performance and poor signal integrity.

SUMMARY OF THE INVENTION

In some aspects, a timing recovery method includes the following operations: performing a time domain timing recovery process according to a predefined cyclic prefix portion of a first symbol during a downstream time-division duplexing frame period to tune a phase locked loop circuit; performing a frequency domain timing recovery process according to at least one second symbol that follows the first symbol during the downstream time-division duplexing frame period to tune the phase locked loop circuit.

In some aspects, a digital subscriber line communication device includes a receiver circuitry and a digital signal processing circuitry. The receiver circuitry is configured to receive a plurality of symbols during a downstream time-division duplexing frame period according to a clock signal, in which the receiver circuitry comprises a phase locked loop circuit configured to generate the clock signal. The digital signal processing circuitry is configured to perform a time domain timing recovery process according to a predefined cyclic prefix portion of a first symbol in the plurality of symbols to tune the phase locked loop circuit, and perform a frequency domain timing recovery process according to at least one second symbol that follows the first symbol in the plurality of symbols to tune the phase locked loop circuit.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system implemented with at least one circuit, and the term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, similar/identical elements in various figures are designated with the same reference number.

Figure 1:
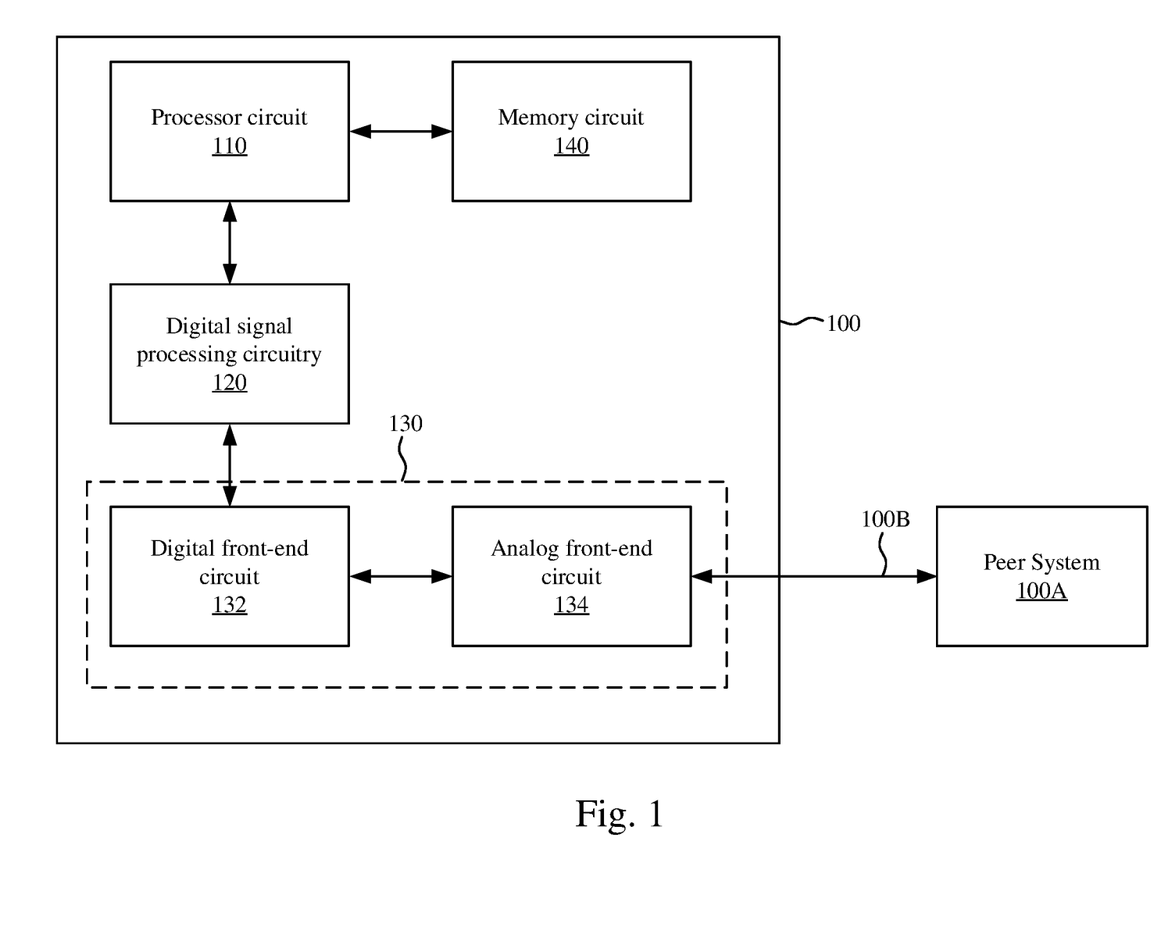
FIG. 1 illustrates a schematic diagram of a digital subscriber line (DSL) communication device according to some embodiments of the present disclosure.

FIG. 1 illustrates a schematic diagram of a digital subscriber line (DSL) communication device 100 according to some embodiments of the present disclosure. The DSL communication device 100 is coupled to a peer system 100A via a medium 100B. In some embodiments, the medium 100B may be a telephone line and/or a twisted pair. In some embodiments, the DSL communication device 100 may be referred to as a customer premises equipment (CPE), and the peer system 100A may be referred to as a DSL access multiplexer (DSLAM), but the present disclosure is not limited thereto. In some embodiments, the peer system 100A and the DSL communication device 100 may have the same (or similar) circuit architecture.

In some embodiments, the DSL communication device 100 may include a processor circuit 110, a digital signal processing circuitry 120, a front-end circuitry 130, and a memory circuit 140. The processor circuit 110 is configured to control the digital signal processing circuitry 120, the front-end circuitry 130, and a memory circuit 140. The digital signal processing circuitry 120 is configured to process DSL signals (which may be, but not limited to, symbols transmitted and/or received based on DSL protocol) in the digital domain. In some embodiments, the digital signal processing circuitry 120 may be implemented with an application specific integrated circuit. The front-end circuitry 130 is configured to process and convert the DSL signals. In some embodiments, the front-end circuitry 130 may include a digital front-end circuit 132 and an analog front-end circuit 134. The digital front-end circuit 132 is configured to process digital DSL signals in the time domain, and convert analog DSL signals from the analog front-end circuit 134 to the digital DSL signals. The analog front-end circuit 134 is configured to process the analog DSL signals and receive analog DSL signals from the peer system 100A via the medium 100B. The memory circuit 140 is configured to store at least one program and/or at least one data to be utilized by the processor circuit 110.

In some embodiments, the digital signal processing circuitry 120 may perform different timing recovery processes based on the received DSL signals during a downstream time-division duplexing (TDD) frame period, in order to tune a loop timing of the front-end circuitry 130. As a result, a fast-timing recovery can be achieved to improve signal quality and system performance. Detailed operations regarding herein will be described with reference to the following figures.

Figure 2A:
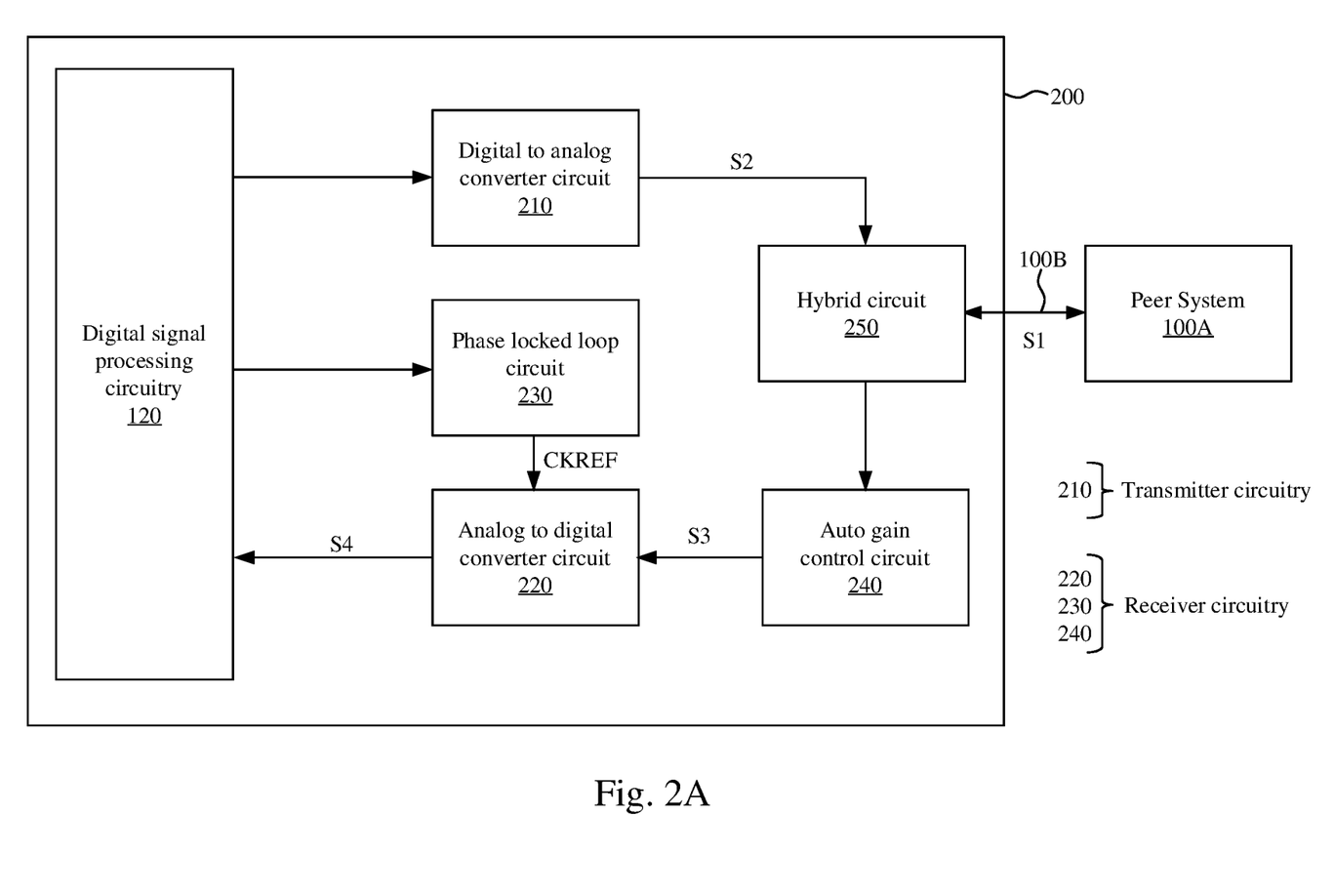
FIG. 2A illustrates a schematic diagram of a DSL communication device according to some embodiments of the present disclosure.

FIG. 2A illustrates a schematic diagram of a DSL communication device 200 according to some embodiments of the present disclosure. In this example, the DSL communication device 200 is a DSL transceiver. Circuits shown in the DSL communication device 200 may be considered as at least one part of the circuits shown in the DSL communication device 100 in FIG. 1.

The DSL communication device 200 includes the digital signal processing circuitry 120, a digital to analog converter circuit 210, an analog to digital converter circuit 220, a phase locked loop circuit 230, an auto gain control circuit 240, and a hybrid circuit 250. In some embodiments, the analog to digital converter circuit 220, the phase locked loop circuit 230, and the auto gain control circuit 240 may be considered as a receiver circuitry that is configured to receive DSL signals S1 from the peer system 100A via the medium 100B. In some embodiments, the digital to analog converter circuit 210 may be considered as a transmitter circuitry that is configured to transmit DSL signals S2 to the peer system 100A via the medium 100B. In some embodiments, the digital to analog converter circuit 210, the analog to digital converter circuit 220, the phase locked loop circuit 230, the auto gain control circuit 240, and the hybrid circuit 250 may be included in the front-end circuitry 130 in FIG. 1.

In some embodiments, the digital to analog converter circuit 210 may convert digital signals into analog DSL signals (i.e., signals S2), and transmit the analog DSL signals to the peer system 100A. In some embodiments, the analog to digital converter circuit 220 may convert analog DSL signals S3 into digital DSL signals S4 according to a clock signal CKREF, and transmit the digital DSL signals S4 to the digital signal processing circuitry 120. In some embodiments, the analog to digital converter circuit 220 may sample the analog DSL signals S3 according to the clock signal CKREF. The digital signal processing circuitry 120 may perform different timing recovery processes according to the digital DSL signals S4 (which may include downstream symbols DS[1]-DS[n] in FIG. 3A) to tune the phase locked loop circuit 230. The phase locked loop circuit 230 is configured to generate the clock signal CKREF to the analog to digital converter circuit 220, in which the frequency (and/or the phase) of the clock signal CKREF is adjusted (i.e., tuned) by the digital signal processing circuitry 120.

The auto gain control circuit 240 is configured to amplify analog DSL signals S1 received by the hybrid circuit 250 with a programmable gain (which is usually auto adjusted) to generate the analog DSL signal S3. The hybrid circuit 250 is configured to provide an impedance matching with the medium 100B. For example, an input impedance of the hybrid circuit 250 may be substantially equal to a characteristic impedance of the medium 100B. In some embodiments, the hybrid circuit 250 may be implemented with resistor(s), amplifier(s), and/or transformer(s), but the present disclosure is not limited thereto.

Figure 2B:
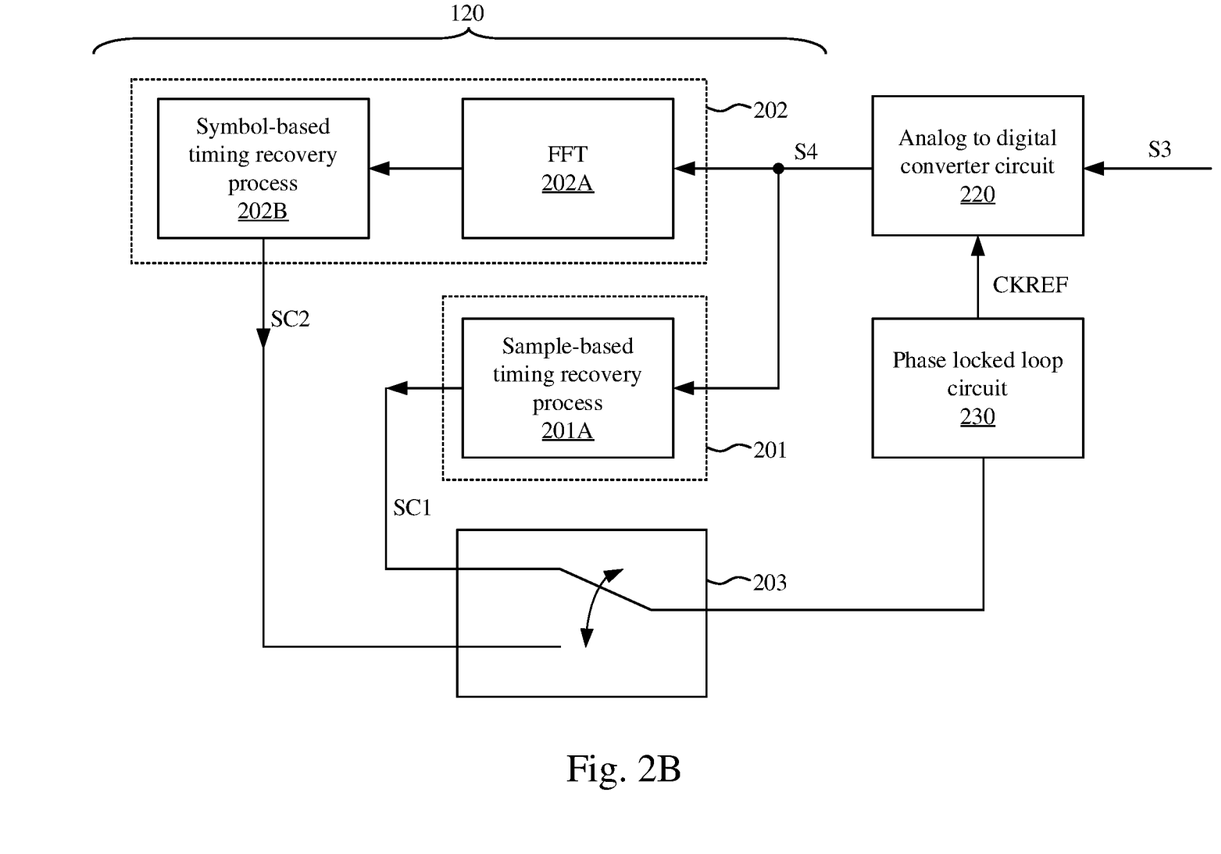
FIG. 2B illustrates a schematic diagram of the digital signal processing circuitry in FIG. 2A according to some embodiments of the present disclosure.

FIG. 2B illustrates a schematic diagram of the digital signal processing circuitry 120 in FIG. 2A according to some embodiments of the present disclosure. For illustrative purposes, FIG. 2B mainly illustrates circuit portions related to timing recovery mechanism in the digital signal processing circuitry 120. The timing recovery mechanism in the digital signal processing circuitry 120 includes processing paths 201 and 202 and a switch circuit 203. The processing path 201 includes a sample-based timing recovery process 201A. The processing path 202 includes a fast Fourier transform (FFT) 202A and a symbol-based timing recovery process 202B.

The sample-based timing recovery process 201A is a time domain timing recovery process performed according to a symbol first received (e.g., the downstream symbol DS[1] in FIG. 3A) in a downstream TDD frame period. In some embodiments, the sample-based timing recovery process 201A is performed to generate a control signal SC1. The FFT 202A is performed on digital DSL signal (e.g., the digital DSL signal S4 in FIG. 2A) generated by the analog to digital converter circuit 220, in which the analog to digital converter circuit 220 may convert at least one symbol (e.g., the downstream symbols DS[2]-DS[n] in FIG. 3A) that follows the first symbol in the downstream TDD frame period to generate the digital DSL signal. The symbol-based timing recovery process 202B is a frequency domain timing recovery process performed according to processed results of the FFT 202A to generate a control signal SC2.

In some embodiments, the processing path 202 may be a typical timing recovery process that is performed in the frequency domain, and the processing path 201 is an improved timing recovery process that is performed in the time domain. Compared with the processing path 202, the sample-based timing recovery process 201A in the processing path 201 is performed without performing the FFT. As a result, the processing path 201 is able to provide a faster tracking (compared with the processing path 202) to the phase locked loop circuit 230.

The switch circuit 203 is switched to receive the control signal SC1 from the processing path 201 during a period for processing the first symbol, and is switched to receive a control signal SC2 from the processing path during the period for processing the at least one symbol that follows the first symbol. The phase locked loop circuit 230 is tuned in response to the received control signal SC1 or SC2.

Figure 3A:
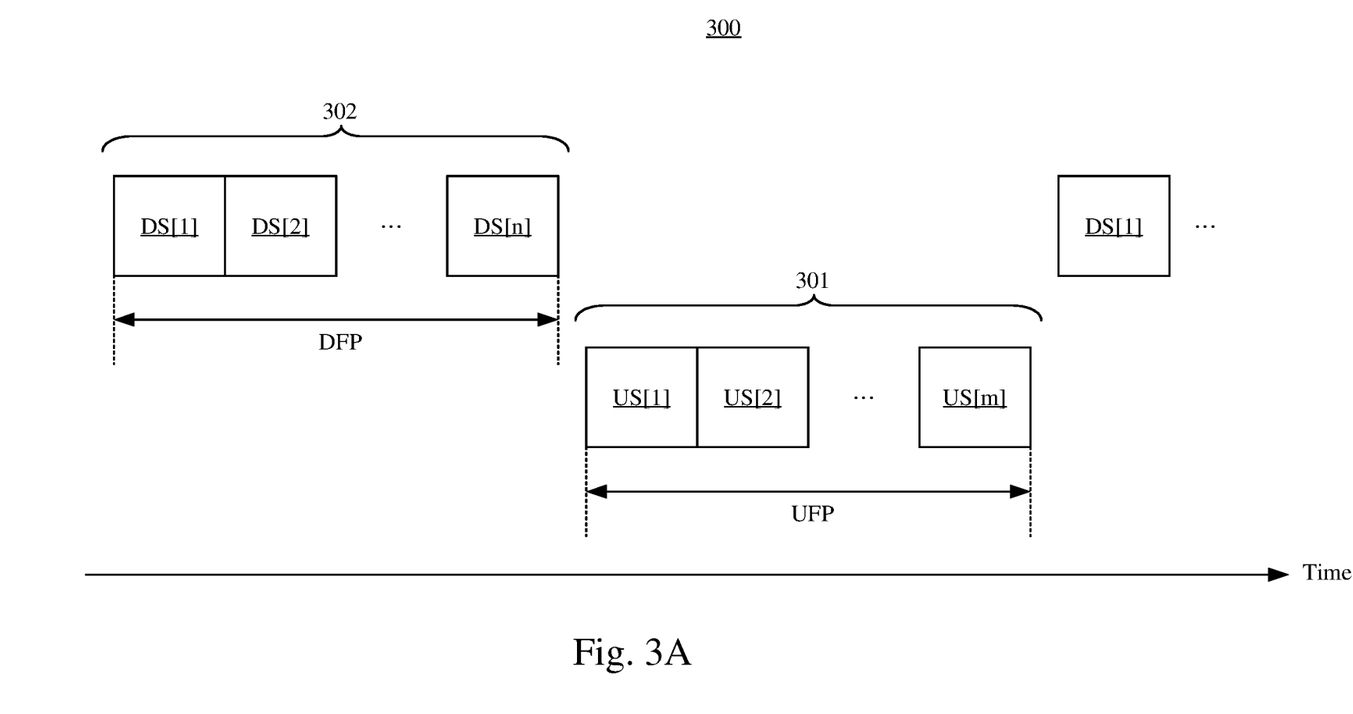
FIG. 3A illustrates a schematic diagram of a time-division duplexing frame structure according to some embodiments of the present disclosure.

FIG. 3A illustrates a schematic diagram of a TDD frame structure 300 according to some embodiments of the present disclosure. As mentioned above, the DSL communication device 100 is configured to communicate with the peer system 100A based on a DSL protocol standard. In other words, symbols shown in FIG. 3A are all DSL symbols. In some embodiments, the DSL protocol standard may be a G.fast protocol standard. In some embodiments, the G.fast protocol standard adopts TDD that separates upstream and downstream frames in different time slots. For example, as shown in FIG. 3A, the TDD frame structure 300 includes an upstream TDD frame 301 and a downstream TDD frame 302. The upstream TDD frame 301 and the downstream TDD frame 302 are alternately transmitted and received in the time domain for G.fast TDD system(s). In some embodiments, the downstream TDD frame 302 indicates a frame transmitted from the peer system 100A to the DSL communication device 100, while the upstream TDD frame 301 indicates a frame transmitted from the DSL communication device 100 to the peer system 100A.

As shown in FIG. 3A, the upstream TDD frame 301 may have m upstream symbols US[1]-US[m], and the downstream TDD frame 302 may have n downstream symbols DS[1]-DS[n], in which values m and n are positive integers greater than 1. In some embodiments, the value m is equal to the value n. Under this condition, the upstream TDD frame period UFP and the downstream TDD frame period DFP have the same duration in time, and thus a symmetric service rate is obtained. Alternatively, in some other embodiments, the value m is not equal to the value n. For example, the value m may be less than or greater than the value n. Under this condition, the upstream TDD frame period UFP and the downstream TDD frame period DFP have different durations in time, and thus an asymmetric service rate is obtained.

In some embodiments, the DSL communication device 100 may perform a timing synchronization during the downstream TDD frame period DFP. Timing error(s) may be accumulated to a maximum value, such that the downstream symbol DS[1], which is first received in the downstream TDD frame period DFP, is the most prone to be affected by the accumulated timing error(s). To reduce impacts from timing error(s), the DSL communication device 100 may utilize the sample-based timing recovery process 201A (i.e., the time domain timing recovery process) in FIG. 2B to provide a fast-timing synchronization. On the other hand, in some embodiments, as the DSL communication device 100 may not receive signals during the upstream TDD frame period UFP, the receiver circuitry in the DSL communication device 100 may operate at an idle state during this period. For example, during the upstream TDD frame period UFP, the digital signal processing circuitry 120 may set the phase locked loop circuit 230 to be at the idle state.

Figure 3B:
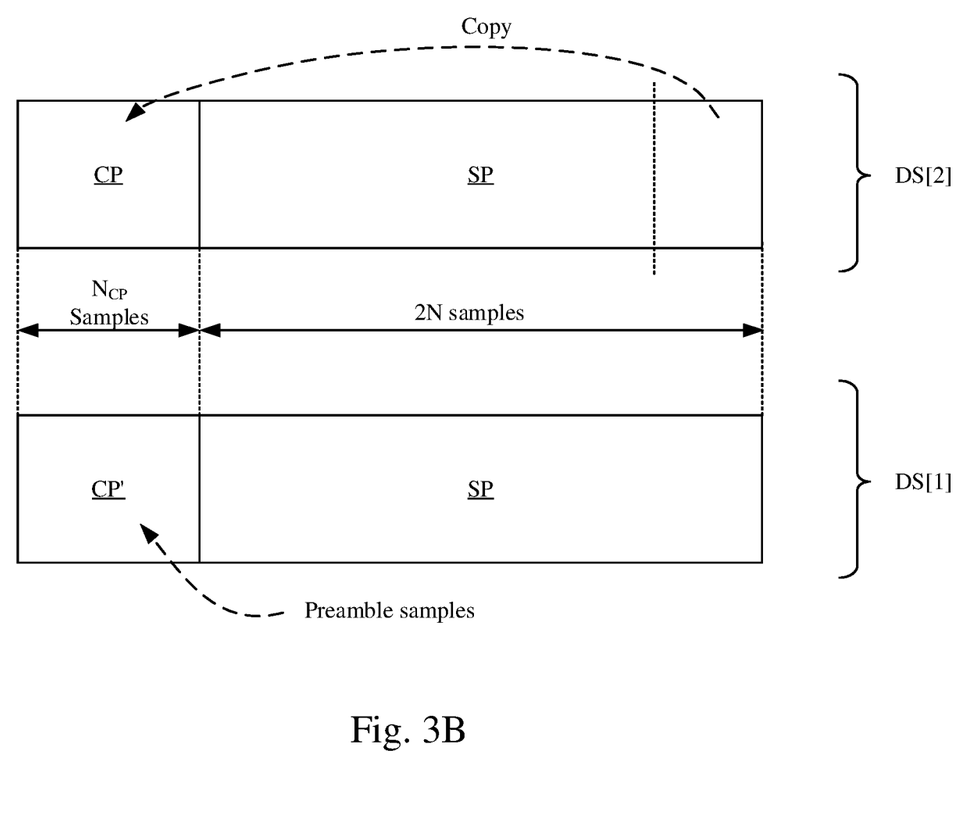
FIG. 3B illustrates a schematic diagram of a structure of the downstream symbols in FIG. 3A according to some embodiments of the present disclosure.

FIG. 3B illustrates a schematic diagram of a structure of the downstream symbol DS[1] and that of the downstream symbol DS[2] in FIG. 3A according to some embodiments of the present disclosure. The downstream symbol DS[1] is a first symbol received in the downstream TDD frame period DFP, and the downstream symbol DS[2] is a symbol that follows the downstream symbol DS[1] in the downstream TDD frame period DFP. The downstream symbol DS[2]-DS[n] may have the same structure.

Each of the downstream symbol DS[1] and the downstream symbol DS[2] has a cyclic prefix portion CP and a main symbol portion SP. 2N samples in the main symbol portion SP are generated by encoding data bits on N discrete tones (or subcarriers) and performing Inverse Fourier Transform (IFFT) on the N discrete tones. In the downstream symbol DS[2], the cyclic prefix portion CP may be generated by copying last few samples (e.g., Ncp samples) of its main symbol portion SP. In some embodiments, the cyclic prefix portion CP is set at the beginning of the symbol, and is to mitigate the inter-symbol interference (ISI) and maintain signal continuity between cyclic prefix portion CP and the main symbol portion SP.

Different from the downstream symbol DS[2], in the downstream symbol DS[1], the cyclic prefix portion is a predetermined cyclic prefix portion (labeled as CP') that includes preamble samples. In some embodiments, the preamble samples in the predetermined cyclic prefix portion CP' are determined based on a modulation of a set of pilot subcarriers. In some embodiments, based on the G.fast protocol standard, the DSL communication device 100 may select one or more best-quality subcarriers as pilot subcarriers, and the peer system 100A may transmit non-data signals (e.g., continuous sine waves) on those pilot subcarriers for the timing synchronization of the DSL communication device 100. Accordingly, by setting a set of predetermined pilot subcarriers for both parties (e.g., the DSL communication device 100 and the peer system 100A), the preamble samples in the predetermined cyclic prefix portion CP' can be generated by modulating the set of predetermined pilot subcarriers. The DSL communication device 100 is thus able to utilize the preamble samples in the predetermined cyclic prefix portion CP' to perform the sampled-based timing recovery process 201A.

Figure 4A:
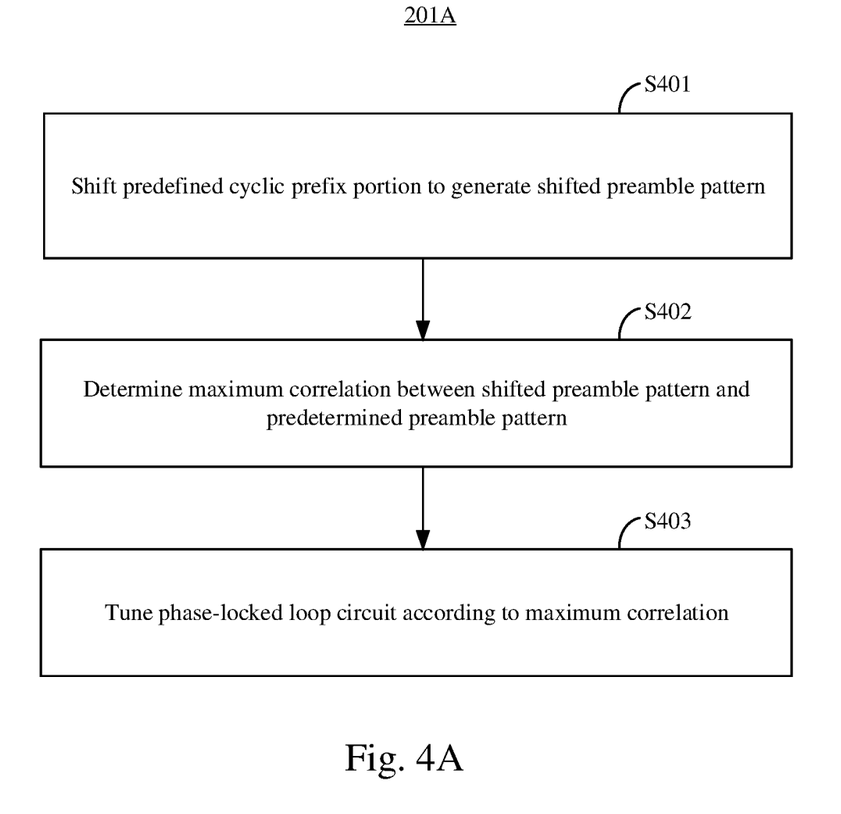
FIG. 4A illustrates a flow chart of operations of the sampled-based timing recovery process in FIG. 2B according to some embodiments of the present disclosure.

FIG. 4A illustrates a flow chart of operations of the sampled-based timing recovery process 201A in FIG. 2B according to some embodiments of the present disclosure. In operation S401, the predefined cyclic prefix portion is shifted to generate a shifted preamble pattern. In operation S402, a maximum correlation between the shifted preamble pattern and a predetermined preamble pattern is determined. In operation S403, the phase-locked loop circuit is tuned according to the maximum correlation.

In some embodiments, the predetermined preamble pattern is a pattern known by both of the DSL communication device 100 and the peer system 100A and is stored in the DSL communication device 100. The digital signal processing circuitry 120 may shift the received preamble samples in the predefined cyclic prefix portion CP' to generate the shifted preamble pattern, and then utilize the predetermined preamble pattern and the shifted preamble pattern to determine the correlation. By repeatedly shifting the received preamble samples and determining the correlation, a maximum correlation between the predetermined preamble pattern and the shifted preamble pattern can be determined. Under this condition, the shifted preamble pattern that generates the maximum correlation may indicate whether the current timing of the clock signal CKREF is early or late. The digital signal processing circuitry 120 may generate the control signal SC1 based on such information to tune the clock signal CKREF generated by the phase locked loop circuit 230.

Figure 4B:
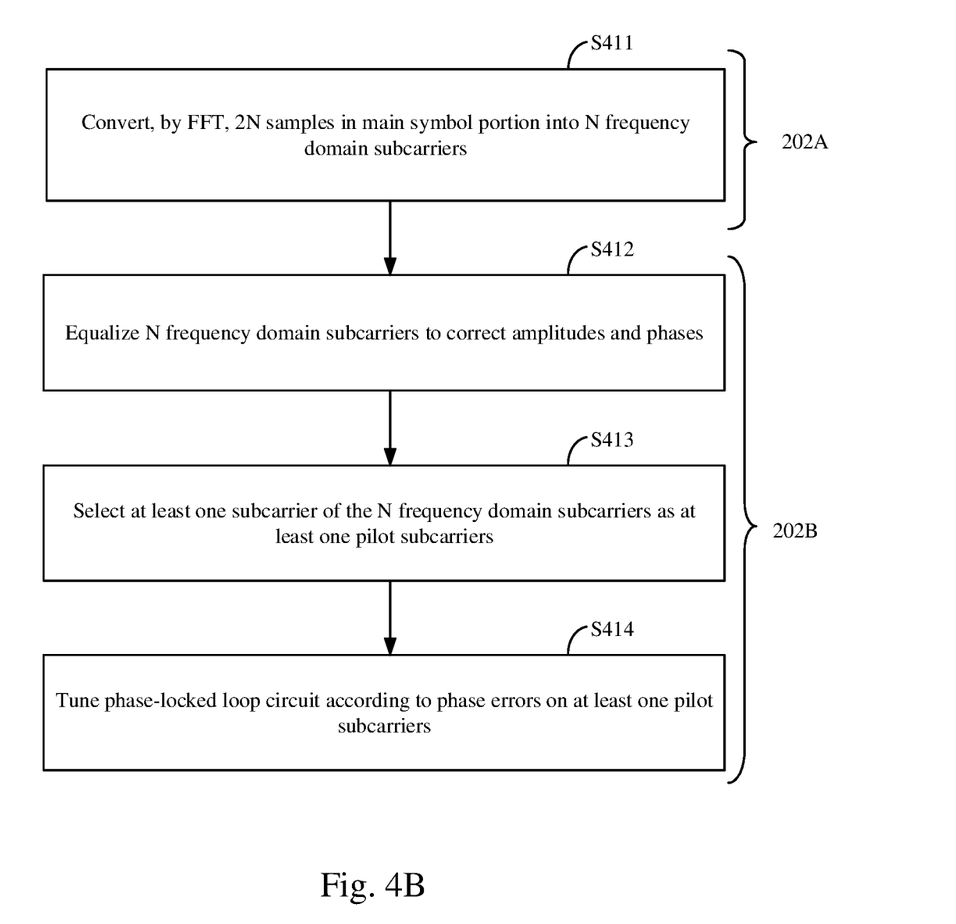
FIG. 4B illustrates a flow chart of operations of the fast Fourier transform (FFT) and the symbol-based timing recovery process in FIG. 2B according to some embodiments of the present disclosure.

FIG. 4B illustrates a flow chart of operations of the FFT 202A and the symbol-based timing recovery process 202B in FIG. 2B according to some embodiments of the present disclosure. In operation S411, 2N samples in main symbol portion are converted into N frequency domain subcarriers by FFT. For example, the FFT 202A may convert the 2N samples in the main symbol portion SP of the downstream symbol DS[2] into the N frequency domain subcarriers. In operation S412, the N frequency domain subcarriers are equalized to correct amplitudes and phases. For example, each of the N frequency domain subcarriers may be processed by a frequency domain equalizer to compensate the channel effect to correct its amplitude and phase. In operation S413, at least one subcarrier of the N frequency domain subcarriers is selected as at least one pilot subcarriers. In operation S414, the phase-locked loop circuit is tuned according to phase errors on the at least one pilot subcarriers.

In some embodiments, the sampled-based timing recovery process 201A may be performed according to one or more downstream symbols that are received earliest (e.g., the downstream symbols DS[1]-DS[3]) during the downstream TDD frame period DFP, and the symbol-based timing recovery process 202B may be performed according to the following downstream symbols received (e.g., the downstream symbols DS[4]-DS[n]) during the downstream TDD frame period DFP. Under this condition, the remaining downstream symbols DS[1]-DS[3] are all configured to have the preamble samples in the predetermined cyclic prefix portion CP'. In other words, the present disclosure is not limited to examples shown in FIG. 3B, FIG. 4A, and FIG. 4B.

Figure 5:
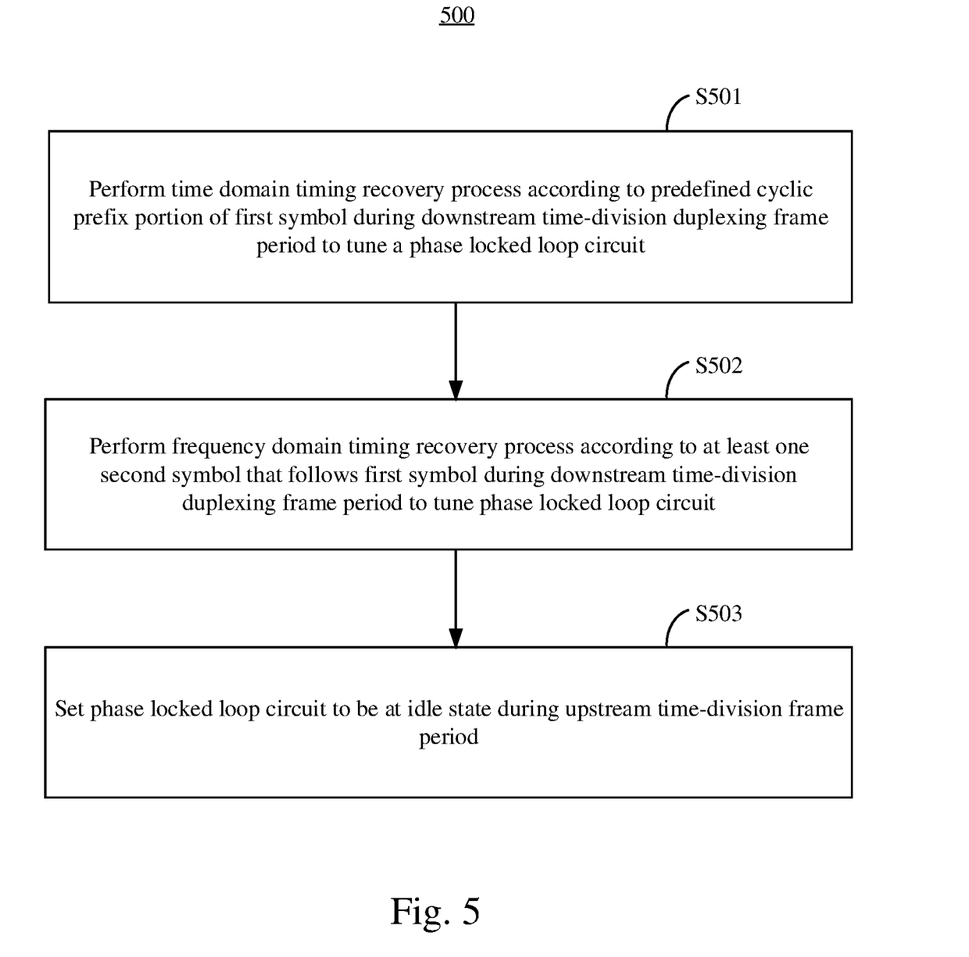
FIG. 5 illustrates a flow chart of a timing recovery method according to some embodiments of the present disclosure.

FIG. 5 illustrates a flow chart of a timing recovery method 500 according to some embodiments of the present disclosure. In some embodiments, the timing recovery method 500 may be performed by the DSL communication device 100. In operation S501, a time domain timing recovery process (e.g., the sample-based timing recovery process 201A) is performed according to a predefined cyclic prefix portion of a first symbol during a downstream time-division duplexing frame period to tune a phase locked loop circuit. In operation S502, a frequency domain timing recovery process (e.g., the symbol-based timing recovery process 202B) is performed according to at least one second symbol that follows the first symbol during the downstream time-division duplexing frame period to tune the phase locked loop circuit. In operation S503, the phase locked loop circuit is set to be at an idle state during an upstream time-division frame period.

The above operations can be understood with reference to above embodiments, and thus the repetitious descriptions are not further given. The above description of the timing recovery method 500 includes exemplary operations, but the operations of the timing recovery method 500 are not necessarily performed in the order described above. Operations of the timing recovery method 500 may be added, replaced, changed order, and/or eliminated, or the operations of the timing recovery method 500 may be executed simultaneously or partially simultaneously as appropriate, in accordance with the spirit and scope of various embodiments of the present disclosure.

As described above, the DSL communication device and the timing recovery method in some embodiments of the present disclosure may utilize time domain timing recovery process and frequency domain timing recovery process to achieve timing synchronization, in which a time domain timing recovery process is performed on the first received symbol during the downstream TDD frame period to provide a fast-tracking. As a result, the overall performance can be improved, and the symbol error rate can be reduced.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely some embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A timing recovery method, comprising:
    performing a time domain timing recovery process according to a predefined cyclic prefix portion of a first symbol during a downstream time-division duplexing frame period to tune a phase locked loop circuit; and
    performing a frequency domain timing recovery process according to at least one second symbol that follows the first symbol during the downstream time-division duplexing frame period to tune the phase locked loop circuit.

2. The timing recovery method of claim 1, wherein the predefined cyclic prefix portion comprises a plurality of preamble samples.

3. The timing recovery method of claim 1, wherein the predefined cyclic prefix portion is determined based on a modulation of a set of pilot subcarriers.

4. The timing recovery method of claim 1, wherein the time domain timing recovery process is performed without performing a fast Fourier transform.

5. The timing recovery method of claim 1, wherein performing the time domain timing recovery process according to the predefined cyclic prefix portion of the first symbol during the downstream time-division duplexing frame period to tune the phase locked loop circuit comprises:
    shifting the predefined cyclic prefix portion to generate a shifted preamble pattern;
    determining a maximum correlation between the shifted preamble pattern and a predetermined preamble pattern; and
    tuning the phase locked loop circuit according to the maximum correlation.

6. The timing recovery method of claim 1, wherein the first symbol is a symbol first received in the downstream time-division duplexing frame period.

7. The timing recovery method of claim 1, wherein the first symbol and the at least one second symbol are transmitted based on a digital subscriber line protocol standard.

8. The timing recovery method of claim 7, wherein the digital subscriber line protocol is a G.fast (fast access to subscriber terminals) protocol standard.

9. The timing recovery method of claim 1, further comprising:
    setting the phase locked loop circuit to be at an idle state during an upstream time-division frame period.

10. A digital subscriber line communication device, comprising:
- a receiver circuitry configured to receive a plurality of symbols during a downstream time-division duplexing frame period according to a clock signal, wherein the receiver circuitry comprises a phase locked loop circuit configured to generate the clock signal; and
- a digital signal processing circuitry configured to perform a time domain timing recovery process according to a predefined cyclic prefix portion of a first symbol in the plurality of symbols to tune the phase locked loop circuit, and perform a frequency domain timing recovery process according to at least one second symbol that follows the first symbol in the plurality of symbols to tune the phase locked loop circuit.

11. The digital subscriber line communication device of claim 10, wherein the predefined cyclic prefix portion comprises a plurality of preamble samples.

12. The digital subscriber line communication device of claim 10, wherein the predefined cyclic prefix portion is determined based on a modulation of a set of pilot subcarriers.

13. The digital subscriber line communication device of claim 10, wherein the digital signal processing circuitry is configured to perform the time domain timing recovery process without performing a fast Fourier transform.

14. The digital subscriber line communication device of claim 10, wherein the digital signal processing circuitry is configured to shift the predefined cyclic prefix portion to generate a shifted preamble pattern, determine a maximum correlation between the shifted preamble pattern and a predetermined preamble pattern, and tune the phase locked loop circuit according to the maximum correlation.

15. The digital subscriber line communication device of claim 10, wherein the first symbol is a symbol first received in the downstream time-division duplexing frame period.

16. The digital subscriber line communication device of claim 10, wherein the first symbol and the at least one second symbol are transmitted based on a digital subscriber line protocol standard.

17. The digital subscriber line communication device of claim 16, wherein the digital subscriber line protocol standard is a G.fast (fast access to subscriber terminals) protocol standard.

* * * * *